(12) United States Patent
Blank et al.

(10) Patent No.: US 7,869,214 B2
(45) Date of Patent: Jan. 11, 2011

(54) PORTABLE HIGH-VOLTAGE TEST INSTRUMENT WITH HOUSING

(75) Inventors: Rudolf Blank, Sulz (AT); Stefan Baldauf, Rankweil (AT)

(73) Assignee: B2 Electronic GmbH, Klaus (AT)

( * ) Notice: Subject to any disclaimer, the term of this patent is extended or adjusted under 35 U.S.C. 154(b) by 0 days.

(21) Appl. No.: 12/692,936

(22) Filed: Jan. 25, 2010

(65) Prior Publication Data

US 2010/0118491 A1 May 13, 2010

Related U.S. Application Data

(63) Continuation of application No. PCT/EP2008/005383, filed on Jul. 2, 2008.

(30) Foreign Application Priority Data

Jul. 25, 2007 (DE) ........................ 10 2007 034 558

(51) Int. Cl.
*H05K 7/20* (2006.01)
(52) U.S. Cl. .................. 361/695; 361/687; 361/690; 165/80.2; 165/122; 174/16.1
(58) Field of Classification Search ................ None
See application file for complete search history.

(56) References Cited

U.S. PATENT DOCUMENTS

| 4,998,067 | A | | 3/1991 | Puckett et al. | |
|---|---|---|---|---|---|
| 5,631,570 | A | | 5/1997 | King | |
| 5,803,603 | A | | 9/1998 | Schlueter | |
| 6,798,655 | B2 | * | 9/2004 | Nagashima et al. | .... 361/679.21 |
| 7,203,062 | B2 | * | 4/2007 | Tsuji | ........................ 361/695 |
| 2005/0077065 | A1 | * | 4/2005 | Kleinecke et al. | ....... 174/17 VA |
| 2005/0252672 | A1 | * | 11/2005 | Kleinecke et al. | ....... 174/17 VA |
| 2006/0198104 | A1 | | 9/2006 | Chang et al. | |
| 2008/0011514 | A1 | * | 1/2008 | Zheng et al. | .............. 174/72 R |

FOREIGN PATENT DOCUMENTS

| CH | 633930 | 12/1982 |
|---|---|---|
| WO | 2007/068018 | 6/2007 |

OTHER PUBLICATIONS

International Search Report for corresponding International Application No. PCT/EP2008/005383, mailed Oct. 30, 2008.
Translation of the International Preliminary Report on Patentability for corresponding International Application No. PCT/EP2008/005383, Issued Feb. 9, 2010.

* cited by examiner

*Primary Examiner*—Boris L Chervinsky
(74) *Attorney, Agent, or Firm*—Myers Wolin, LLC

(57) ABSTRACT

A portable high-voltage test instrument comprises an electronic unit having means for producing a test voltage located in the kV range, a control area cooperating with the electronic unit, at least one terminal for the component or cable to be tested and for an external voltage supply, a housing for permanently accommodating the electronic unit and a cooling system, disposed inside the housing, for cooling the electronic unit, the cooling system comprising an air-cooled assembly having an air inlet and an air outlet. This housing is provided with a lid part that can be moved between an open and a closed position, such that all terminals, the control area and the air inlet and air outlet are covered in closed position thereof, whereas all terminals, the control area and the air inlet and air outlet are unobstructed in open position thereof.

6 Claims, 2 Drawing Sheets

PORTABLE HIGH-VOLTAGE TEST INSTRUMENT WITH HOUSING

CROSS REFERENCE TO RELATED APPLICATIONS

This is a continuation application of International Application PCT/EP2008/005383, filed on Jul. 2, 2008, which claims priority to DE Application 10 2007 034 558.8, filed Jul. 25, 2007, the contents of each being incorporated by reference herein.

FIELD

The present invention relates to a portable high-voltage test instrument comprising an electronic unit having means for producing a test voltage located in the kV range, a control area cooperating with the electronic unit, at least one terminal for the component or cable to be tested and if necessary for an external voltage supply, a housing for permanently accommodating the electronic unit and a cooling system, disposed inside the housing, for cooling the electronic unit, the cooling system comprising an air-cooled assembly having an air inlet and an air outlet.

BACKGROUND

Such high voltage test instruments are used in particular for what are known as VLF (Very Low Frequency) testing of cables, wherein a cable to be tested for damage is subjected to an a.c. voltage—which is selected to correspond to the type and length of the cable to be tested—in a range from a few kV to several tens of kV or even 100 kV at a low frequency of preferably 0.1 Hz. In this way it is possible to test cables having lengths of several kilometers for damage to their insulation or the like. However, high-voltage test instruments of the class in question are also suitable for testing other electrical components or subassemblies, such as capacitors, resistors, transformers, motors, generators, switches or relays. Likewise, however, a high-voltage test instrument of the class in question can also be designed for a d.c. voltage test or what is known as 50-Hz test.

The test voltage necessary for test operation is produced by the electronic unit of a test instrument of the class in question, preferably amplifying or transforming an input voltage present at a terminal for an external voltage supply by means of an amplifier operating in what is known as class-AB mode. The term electronic unit is to be understood broadly in the present context, since a test voltage suitable for the intended application can be produced even by means of simple circuit arrangements (for example, comprising at least one switch and one resistor). Even a portable voltage generator can be used as the external voltage supply, especially for measurements in the field. However, battery-powered operation of a high-voltage test instrument of the class in question is also conceivable, and so any terminal that may be present for an external voltage supply can be used for recharging the battery.

High-voltage test instruments of the class in question also have a control area, which preferably has not only some control elements for selecting the test voltage or the time variation of the test voltage in the manner of a test program but also a display and/or other indicating elements, with which the functions of the instrument and the result of the test can be monitored.

Compared with other portable technical instruments, however, the electronic unit of high-voltage test instruments of the class in question generates an extreme amount of heat, since, depending on the particular design of the electronic unit, large heat losses on the order of magnitude of 20 W up to several kW occur and have to be dissipated as waste heat during high-voltage amplification or switching. The cooling system must therefore meet particularly exacting requirements, and this proves to be particularly difficult, especially against the background that increasingly more compact and lightweight instruments are desired for reasons of the greatest possible portability.

The present invention therefore relates to high-voltage test instruments in which the cooling system is provided with an air-cooled assembly having an air inlet and an air outlet, wherein the air-cooled assembly either already represents the primary cooling system of the high-voltage test instrument or is a secondary system, such as for a liquid-cooled assembly and especially an oil-cooled assembly. In the present case the cooling system is integrated into the same housing of the high-voltage test instrument in which the electronic unit of the test instrument is also permanently accommodated, while in the prior art there are usually provided openings as air inlet and/or air outlet in one or more side walls of the housing.

In high-voltage test instruments cooled primarily by air, it is to be taken into consideration that particularly exacting requirements must be imposed in this case also on the cooling members or on the connection thereof to the electronic unit. In this regard, reference is made to PCT/AT 2006/000510, where there is described a suitable arrangement of cooling members for a high-voltage test instrument of the class in question.

In the case of portable use, the high-voltage test instruments described in the foregoing are carried to the respective cable or component to be tested and then started up on the spot. Under these conditions, special care is to be taken that the electronic unit of a high-voltage test instrument of the class in question is adequately protected against ingress of dirt or dust and/or against ingress of water, especially also during transportation.

Heretofore a separate transport housing, for example in the form of a carrying case or a carrying bag, from which the high-voltage test instrument must be removed before being started up, has been provided for this purpose. In view of the weight thereof, often several tens of kg, this is indeed cumbersome for the instruments of the class in question, but is nevertheless necessary in order to have free access to the terminals of the high-voltage test instrument and also to keep the air inlet and air outlet unobstructed, since otherwise the instrument would rapidly overheat.

For various technical instruments, however, there are already known, for example from U.S. Pat. No. 5,631,570, 5,803,603 and 4,998,067, instrument housings that permanently accommodate the electronic unit and offer some protection against the potential ingress of water or dust. None of these, however, are sufficiently suitable for transportation and/or operation of the respective instrument under adverse environmental conditions, such as rain.

SUMMARY

Against this background, the object of the present invention is to protect a high-voltage test instrument of the class in question effectively against the ingress of dirt and/or the ingress of water using simple means. It is further intended to assure smooth and if possible simple operation of the high-voltage test instrument while achieving adequate capacity of the cooling system.

For this purpose the housing that permanently accommodates the electronic unit of the high-voltage test instrument is intended to be provided with a lid part that can be moved between an open and a closed position, such that all terminals, the control area and the air inlet and air outlet are covered in closed position thereof, whereas all terminals, the control area and the air inlet and air outlet are unobstructed in open position thereof.

According to the invention, therefore, there is provided a high-voltage test instrument which, for better protection against the ingress of water and dirt, is provided with a housing that can be completely closed by means of a lid part, so that no water and/or dust or other dirt whatsoever can penetrate into the terminals, the air inlet and air outlet and the control elements of the control area when the lid is in closed position. For this purpose it is further provided that the air inlet, air outlet, all terminals and also the control area are arranged in such a way that, when the lid part is opened, they are sufficiently freely accessible or unobstructed that the instrument can be started up directly without the danger of overheating. It is also of substantial importance for the present invention that a separate air inlet and a separate air outlet are provided, so that, when the lid part is opened, a well-defined air flow can be achieved through the housing in order to dissipate large amounts of waste heat effectively.

Inasmuch as claim 1 specifies that the terminals and the control area are unobstructed when the lid part is opened, this is to be understood to mean that, in the case of the terminals, sufficient space is available for connection of the cables or components to be connected thereto and, in the case of the control area, all control elements and any indicating elements that may be present can be operated and read without restriction. The air inlet and air outlet are to be sufficiently unobstructed that an air flow adequate for cooling the instrument can enter in the region of the air inlet and be discharged again as exhaust air in the region of the air outlet.

In a first preferred improvement of the invention, it is provided that the lid part is constructed in the form of a housing lid fastened pivotally to the top side of the rest of the housing, such that it completely closes the housing in closed position. Thus, when the lid part is in closed position, the entire high-voltage test instrument is completely closed and enclosed by its housing, whereas all instrument components and terminals necessary for operation of the instrument, including the air inlet and air outlet, become unobstructed by simple pivoting of the lid part. This corresponds to a degree of protection that makes it possible to transport the instrument even under the most adverse conditions.

Furthermore, it is advantageously provided in an inventive high-voltage test instrument of the aforesaid type that the air inlet and air outlet of the cooling system integrated into the housing are constructed on opposite sides in a cover plate forming the top side of the part of the high-voltage test instrument covered in closed position of the housing lid. Thereby intake of the supply air for the air-cooled assembly during operation of the instrument with opened lid part can take place in the region of the top side of the instrument on one side of the cover plate and discharge of the aforesaid exhaust air can take place once again on the other side of the cover plate. For air intake, there is preferably used a commercial fan, which is integrated into the housing at a suitable location. By virtue of their arrangement on opposite sides on the top side of the high-voltage test instrument, the air inlet and air outlet are separated from one another by a distance sufficient to meet the exacting requirements of necessary cooling capacity, since the exhaust air heated during passage through the high-voltage test instrument is not sucked in again in the region of the air inlet. In addition, the fact that the air inlet and air outlet are provided on the top side of the housing ensures that any water spatter that might arrive from the side of the high-voltage test instrument cannot penetrate easily into the instrument housing. Furthermore, given the aforesaid arrangement of air inlet and air outlet in spaced-apart lateral peripheral regions of the cover plate, the cooling air can be passed in longitudinal direction through the entire housing, as will be explained hereinafter.

In this regard it is also advantageous to provide deflecting means for the supply air and the exhaust air at the air inlet and air outlet respectively, in order to achieve lateral intake of the supply air and lateral discharge of the exhaust air on the opposite side during operation of the high-voltage test instrument. This further increases the effectiveness of the cooling system of an inventive high-voltage test instrument, since the lateral intake of supply air occurring on one side of the instrument, in combination with the discharge of exhaust air occurring in the same direction on the other side, or in other words on the opposite side, ensures that a heat dome cannot develop around the high-voltage test instrument.

Furthermore, the high-voltage test instrument is preferably configured such that the air inlet and air outlet are open only toward the sides and are permanently covered in upward direction. This can be achieved in particularly simple manner by the aforesaid scoop-shaped deflecting means. Thereby an inventive high-voltage test instrument can also be operated without further protective means even during rain, since the upper covering of the air inlet and air outlet ensures that no rain falling substantially vertically from above can penetrate into the air inlet and air outlet. Even when the cover is opened, therefore, the instrument is suitable for field service during rain, or in any case as long as the control area and the control elements are also sealed against the ingress of water spatter. For this purpose it is also preferable to take care that the terminals—especially when connecting cables are plugged in—are also protected or sealed as well as possible against water spatter, for example by providing appropriate covering means in their regions also. Thus the high-voltage test instrument described here is able in a particularly simple manner to meet the exacting protective requirements of the IP 54 protective enclosure according to DIN EN 60529 or VDE 0470.

It is extremely advantageous in this case to provide that the cooling air is sucked in substantially horizontally or at an angle from below in the region of the air inlet and that the exhaust air is discharged substantially horizontally or at a downward angle in the region of the air outlet. Corresponding deflecting means, which on the one side appropriately guide the air flow sucked in horizontally or at an angle into the housing interior and on the opposite side appropriately discharge the exhaust air once again, while simultaneously covering the air inlet and air outlet, are easy to construct. In the region of the respective deflecting means there are preferably formed numerous louvers, so that (lateral) ingress of dirt or water together with the air flow can also be prevented as extensively as possible. The housing of an inventive high-voltage test instrument can preferably be a plastic housing that does not have any kind of outward openings and is provided with a lid part of the same plastic fixed pivotally thereto. Since an air inlet and an air outlet are disposed in such a way according to the invention that they are unobstructed when the lid part is opened, heat buildup inside the housing is not to be expected despite the fact that the plastic housing can be completely closed.

As already mentioned hereinabove, the foregoing measures, wherein an air-cooled assembly represents the primary cooling system, make it possible to construct a compact high-voltage test instrument in preferred manner and despite the large amounts of lost heat to be dissipated. For this purpose there can be expediently designed a cooling system provided with a first air-guiding portion, in which a fan is disposed to suck in the cooling air and in which the cooling air sucked in through the air inlet in the region of the top side of the housing is guided along the inside of a side wall of the housing to the housing bottom, the first air-guiding portion being adjoined by a second air-guiding portion, which traverses the housing in longitudinal direction on the bottom side of the housing, adjoins a cooling member of the electronic unit and leads at the opposite side wall of the housing to a third air-guiding portion at the opposite side wall of the housing, where the cooling air is guided back toward the top side of the housing and the air outlet. Instead of a flow through the housing in longitudinal direction along the bottom side of the housing, however, it is also possible to design an air guide in which the second air-guiding portion traverses the housing in longitudinal direction at mid-height of the housing.

The cooling system designed as in the foregoing is characterized by particularly effective removal of the waste heat generated by the electronic unit, by the fact that the cooling air traversing the housing in longitudinal direction along the bottom side of the housing flows around the cooling member joined in heat-conducting relationship to the electronic unit and then exits the housing once again through the air outlet at its top side, preferably in a manner deflected laterally by the already mentioned deflecting means. This cooling member, which has longitudinal cooling fins within the second air-guiding portion running along the bottom side of the housing, advantageously extends over a substantial part of the entire housing width, so that as much waste heat as possible can be dissipated to the cooling air. It is further advantageous for the third air-guiding portion also to adjoin a side wall of the housing, so that heat can be dissipated outward through the housing in this region also.

BRIEF DESCRIPTION OF THE DRAWINGS

The invention will be explained in more detail hereinafter on the basis of the drawing, wherein.

DETAILED DESCRIPTION

Figure 1:
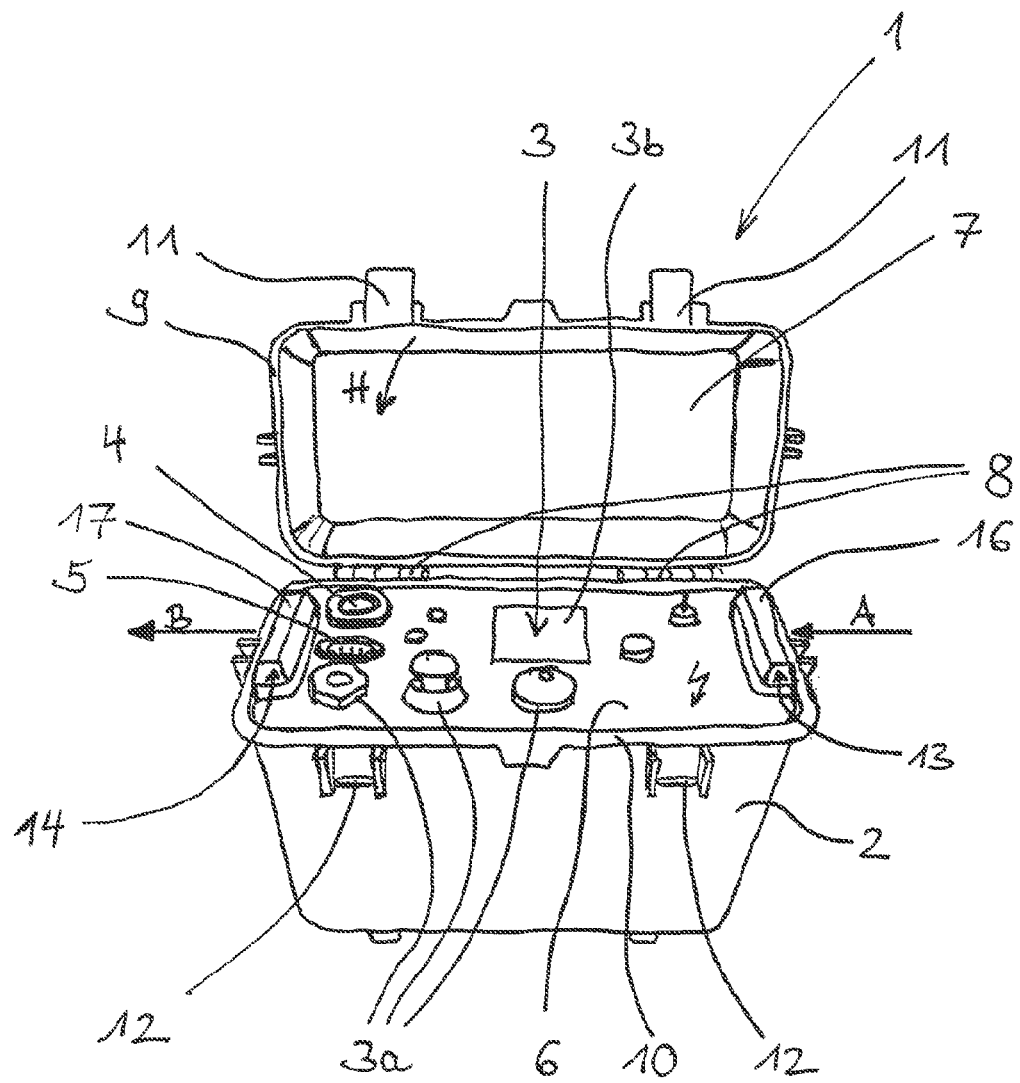
FIG. 1 shows a perspective view of an exemplary embodiment of a high-voltage test instrument.

Portable high-voltage test instrument 1 shown in FIG. 1 has a housing 2, in which electronic unit 24—not illustrated in FIG. 1—of high-voltage test instrument 1 is permanently accommodated underneath cover plate 6, which is equipped with control area 3 and terminals 4, 5. Terminal 4 located at the rear in FIG. 1 is used as the high-voltage output for the cable to be tested, while terminal 5, situated further forward, is used as the input for an external current supply—not illustrated. Several control elements 3a as well as a display 3b for control of high-voltage test instrument 1 are disposed on the control area.

Housing 2 further comprises a lid part in the form of a housing lid 7, which is mounted pivotally on the rest of housing 2 by means of two hinges 8 in the region of the top side of the housing. Lid part 7 and the rest of housing 2 are provided with peripheral sealing faces 9, 10 respectively, which cooperate sealingly when lid part 7 is closed, thus preventing ingress of dust or dirt into the region of high-voltage test instrument 1 covered by lid part 7. On lid part 7 and on the rest of housing 2 there are disposed locking elements 11, 12, with which housing 2 of high-voltage test instrument 1 can be closed after lid part 7 has been pivoted from its open position illustrated in FIG. 1 to its closed position, as illustrated by arrow H (in this regard see also FIG. 2). In this closed position not illustrated, housing 2 is completely closed and not only all terminals 4, 5 and control area 3 but also air inlet 13 and air outlet 14 are covered by lid part 7, whereas they are unobstructed in the open position illustrated in FIG. 1.

Air inlet 13 and air outlet 14 are each constructed as openings 15—which are opposite one another relative to the center of cover plate 6—in peripheral regions of top cover plate 6, a deflecting means 16, 17 being further mounted on the opening in the region of air inlet and air outlet 13, 14, whereby the supply air arriving substantially horizontally from the side in the direction of arrow A is deflected on the side of air inlet 13 in the direction of arrow C (see FIG. 2) into housing 2, and on the side of air outlet 14 the exhaust-air flow is deflected in the direction of arrow G out of the housing 2 in such a way that the exhaust air can be discharged to the atmosphere again substantially horizontally in the direction of arrow B on the opposite side. These deflecting means 16, 17 simultaneously form a top cover for air inlet 13 and air outlet 14 respectively, so that no water spatter or rainwater falling vertically from above can penetrate into housing 2. Deflecting means 16, 17 are not completely open on the sides of the air inlet and air outlet respectively, but for the purpose of protection against the ingress of dust or water are equipped with louvers 18, 19.

Figure 2:
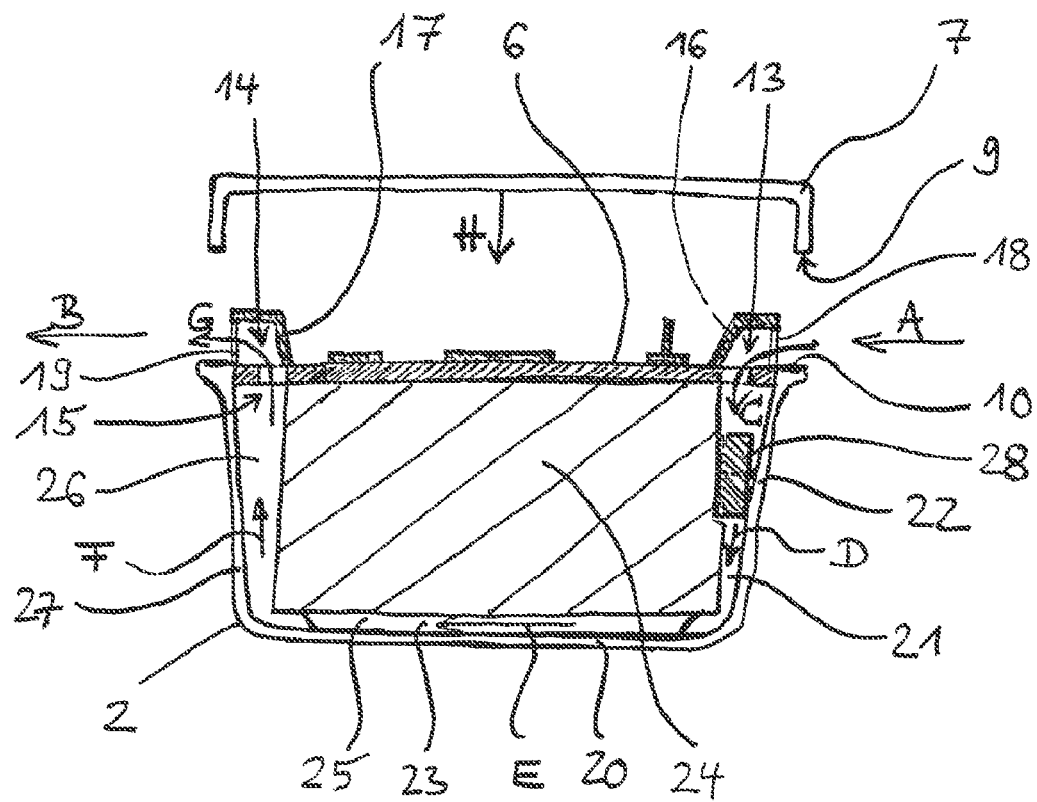
FIG. 2 shows a schematic longitudinal section in a vertical plane through the high-voltage test instrument of FIG. 1.

The schematic sectional diagram of FIG. 2 illustrates the cooling-air flow through high-voltage test instrument 1. After its deflected entry into housing 2, the cooling air flows in the direction of arrow D through a first air-guiding portion 21, which leads from air inlet 13 to housing bottom 20 and is bounded on the one hand by a side wall 22 of housing 2 and on the other hand by electronic unit 24. A fan 28 designed as a radial-flow fan is disposed in space-saving manner in first air-guiding portion 21.

Upon arrival at housing bottom 20, the cooling air is deflected into a second air-guiding portion 23, in which the cooling air traverses housing 2 in longitudinal direction according to arrow E. Above this second air-guiding portion there is disposed electronic unit 24—illustrated only schematically—of high-voltage test instrument 1, which is joined via a support member of electronic unit 24 to a cooling member, which has the form of plates 25, which run in longitudinal direction and bound second air-guiding portion 23, and between which the cooling air can flow. These plates 25 are simultaneously in contact with the inside of housing bottom 20, so that the waste heat can be dissipated not only via heat removal by the cooling air but also via the housing wall to the environment.

Second air-guiding portion 23 is adjoined by a third air-guiding portion 26, which again is bounded by a side wall 27 of housing 2 and in which the heated cooling air is guided in the direction of arrow F from housing bottom 20 to air outlet 14 in cover plate 6 disposed at the top side of the housing, where it is deflected by deflecting means 17 in the direction of arrow G and can finally exit the housing once again horizontally as exhaust air in the direction of arrow B.

We claim:

1. A portable high-voltage test instrument comprising:
   an electronic unit having means for producing a test voltage located in the kV range;
   a control area cooperating with the electronic unit;
   at least one terminal for a component or cable to be tested and for an external voltage supply;
   a housing for permanently accommodating the electronic unit; and a cooling system, disposed inside the housing, for cooling the electronic unit, the cooling system comprising an air-cooled assembly having an air inlet and an air outlet;

wherein the housing is provided with a lid part that is movable between an open and a closed position such that the at least one terminal, the control area and the air inlet and air outlet are covered in the closed position thereof, whereas the at least one terminal, the control area and the air inlet and air outlet are unobstructed in the open position thereof;

wherein the lid part is constructed in the form of a housing lid pivotally fastened to a top side of the housing such that it completely covers the housing in the closed position; and wherein the air inlet and air outlet are disposed on opposite sides in a cover plate forming a top side of a part of the high-voltage test instrument covered in the closed position of the housing lid.

2. A high-voltage test instrument according to claim 1, wherein deflecting means for supply air and exhaust air are provided at the air inlet and air outlet in order to achieve lateral intake of the supply air at the air inlet and lateral discharge of the exhaust air at the air outlet during operation of the high-voltage test instrument.

3. A high-voltage test instrument according to claim 1, wherein the air inlet and air outlet are open only toward the sides of the housing and are permanently covered in an upward-facing direction.

4. A high-voltage test instrument according to claim 3, wherein cooling air is sucked in substantially horizontally or at an angle from below in the region of the air inlet and exhaust air is discharged substantially horizontally or at a downward angle in the region of the air outlet.

5. A high-voltage test instrument according to claim 1, wherein the air-cooled assembly represents the primary cooling system of the high-voltage test instrument.

6. A high-voltage test instrument according to claim 5, wherein the cooling system is provided with a first air-guiding portion, including a fan disposed to suck in cooling air through the air inlet in the region of the top side of the housing and guide the cooling air along an inside of a side wall of the housing to a housing bottom, the first air-guiding portion being adjoined by a second air-guiding portion that traverses the housing in a longitudinal direction on the housing bottom, and adjoins a cooling member of the electronic unit and leads at an opposite side wall of the housing to a third air-guiding portion, in which the cooling air is guided back toward the top side of the housing and the air outlet.

* * * * *